(12) United States Patent
Chen et al.

(10) Patent No.: US 9,176,167 B1
(45) Date of Patent: Nov. 3, 2015

(54) PROBE AND METHOD OF MANUFACTURE FOR SEMICONDUCTOR WAFER CHARACTERIZATION

(71) Applicants: Dong Chen, Tucson, AZ (US); Mark Munch, Tucson, AZ (US)

(72) Inventors: Dong Chen, Tucson, AZ (US); Mark Munch, Tucson, AZ (US)

(73) Assignee: BRUKER NANO INC., Santa Barbara, CA (US)

( * ) Notice: Subject to any disclaimer, the term of this patent is extended or adjusted under 35 U.S.C. 154(b) by 289 days.

(21) Appl. No.: 13/715,486

(22) Filed: Dec. 14, 2012

Related U.S. Application Data

(63) Continuation-in-part of application No. 13/332,657, filed on Dec. 21, 2011, now Pat. No. 9,057,757.

(60) Provisional application No. 61/525,770, filed on Aug. 21, 2011.

(51) Int. Cl.
| | |
|---|---|
| *G01R 3/00* | (2006.01) |
| *G01R 1/067* | (2006.01) |
| *G01R 31/44* | (2006.01) |
| *G01R 31/26* | (2014.01) |
| *G01R 31/02* | (2006.01) |
| *G09G 3/00* | (2006.01) |

(52) U.S. Cl.
CPC .............. *G01R 1/06761* (2013.01); *G01R 3/00* (2013.01); *G01R 31/025* (2013.01); *G01R 31/2635* (2013.01); *G01R 31/44* (2013.01); *G09G 3/006* (2013.01)

(58) Field of Classification Search
CPC .... G01R 1/0408; G01R 1/073; G01R 31/025; G01R 31/2635; G01R 31/44; G09G 3/006
USPC .......................................................... 324/414
See application file for complete search history.

(56) References Cited

U.S. PATENT DOCUMENTS

| | | | |
|---|---|---|---|
| 5,873,161 A * | 2/1999 | Chen et al. ....................... 29/830 |
| 6,211,690 B1 * | 4/2001 | Fjelstad ................... 324/754.18 |
| 6,720,787 B2 * | 4/2004 | Kimura et al. ........... 324/755.09 |
| 6,906,541 B2 * | 6/2005 | Kimura ..................... 324/763.01 |
| 6,969,622 B1 * | 11/2005 | Kokubo et al. .................. 438/14 |
| 7,679,381 B2 | 3/2010 | Ma |
| 7,859,267 B2 * | 12/2010 | Andresen et al. ............. 324/414 |
| 2002/0175695 A1 * | 11/2002 | Ahmann et al. ............... 324/761 |
| 2004/0012383 A1 * | 1/2004 | Kimura ....................... 324/158.1 |
| 2006/0134378 A1 * | 6/2006 | Kimura et al. ................ 428/137 |
| 2006/0176064 A1 * | 8/2006 | Kimura et al. ................ 324/691 |
| 2007/0139061 A1 * | 6/2007 | Eldridge et al. .............. 324/754 |
| 2008/0072422 A1 * | 3/2008 | Levante et al. .................. 29/852 |
| 2008/0242128 A1 * | 10/2008 | Hilty et al. ....................... 439/91 |
| 2011/0043234 A1 * | 2/2011 | Lee et al. .................. 324/755.09 |

* cited by examiner

*Primary Examiner* — Jermele M Hollington
*Assistant Examiner* — Christopher McAndrew
(74) *Attorney, Agent, or Firm* — Antonio R. Durando

(57) ABSTRACT

A conductive probe for semiconductor material characterization includes a distal metallic layer of micrometer-size particles, an intermediate layer of conformable conductive elastomer material, and a pin attached to the elastomer layer. The probe is preferably manufactured by filling a recess in a bottom plate with the metallic particles, coupling a top plate thereto with a perforation aligned with the recess, and filling the perforation with uncured conductive elastomer. The pin, preferably spring-loaded, is pressed into the perforation to compress the silicone to its intended probe size. The silicone is then allowed to cure at room temperature or in a heated environment, or both.

20 Claims, 12 Drawing Sheets

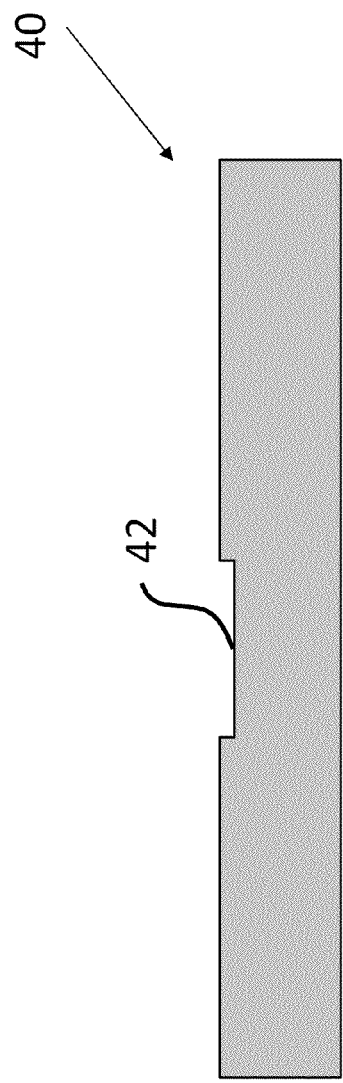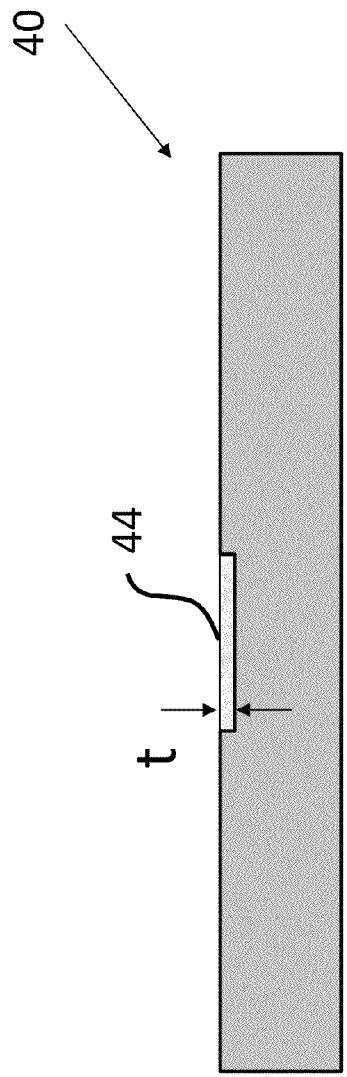

PROBE AND METHOD OF MANUFACTURE FOR SEMICONDUCTOR WAFER CHARACTERIZATION

RELATED APPLICATIONS

This application is a continuation-in-part application of U.S. Ser. No. 13/332,657, filed Dec. 21, 2011, which was based on and claimed the priority of U.S. Provisional Application Ser. No. 61/525,770, filed Aug. 21, 2011.

BACKGROUND OF THE INVENTION

1. Field of the Invention

This invention pertains to the general field of testing of semiconductor materials. In particular, it pertains to an improvement in the probe used for characterizing the properties of electroluminescent semiconductor wafers.

2. Description of the Prior Art

The characterization of semiconductor materials and in particular light-emitting semiconductor structures at the wafer-level (i.e., after forming the p-n junction and the active quantum well layers, but prior to the chip processing steps) is typically carried out with a non-destructive wafer probe. A conductive probe is temporarily placed in contact with the top of the epi-wafer (p-GaN) layer while an electrode contacts the n-GaN layer through either the edge of the wafer or through other means that allow access to the n-GaN layer. Such typical layout is illustrated in FIG. 1. When energized, the conductive probe, the semiconductor p-n junction structure on the wafer and the electrode form a temporary light-emitting device. By injecting a known current into the junction, light will emit from the device and the spectral properties and their relationship with the electrical properties can be measured and characterized.

Although the method of using conductive probes for semiconductor wafer measurements and tests has been known in the field, the issues of making good, consistent probe-wafer contact with repetitive results are still problematic challenges that vary from application to application. For light-emitting wafer testing, a well-defined uniform contact area with minimal contact resistance is essential. Therefore, the probe material should be stable under a variety of electrical drive conditions.

One major challenge is the precise estimation and consistent repetitiveness of the true contact area between the probe and the surface of the wafer, which affects conductivity and all related measurement parameters. A hard metallic probe would be ideal for perfectly flat and smooth surfaces because of the high and uniform conductivity of metals. However, the surface of wafers is typically not perfectly smooth, but it contains a degree of roughness sufficient to create non-uniformities in the way the probe contacts the wafer. Therefore, different probes with softer tips have been used to cause the probe to deform under pressure and conform to the profile of the wafer's surface. For example, U.S. Pat. No. 7,679,381 (issued to Ma) describes a probe that includes a conductive deformable tip made of elastomer or polymer material and a pressure control that together ensure a good contact with the wafer under test as various measurements are taken across its surface.

Another type of probe used to improve the uniformity of contact over the test wafer consists of a traditional metallic probe with a conductive silicone tip, such as RTV (Room Temperature Vulcanization) liquid silicone material. Such conductive silicone consists of metallic flakes, typically silver particles, with a nominal diameter in the order of micrometers, dispersed in a silicone carrier that is attached and cured onto the tip of the metal probe. (Depending on the application, other conductive fillers may be used, such as graphite, silver-coated copper, nickel, and so on.) In use, the probe is pressed onto the surface of the wafer, causing its deformable tip to conform to wafer surface irregularities, thereby providing a substantially uniform contact throughout.

FIG. 2 illustrates a probe station for light-emitting epi-wafer characterization using a conducting silicone probe of the type described above, or any other deformable probe, including the novel probe of the invention described below. A spring-loaded probe 10 is used as an anode electrode. The probe is engaged to the surface S of the wafer W and makes contact with the p-GaN layer. The loading force applied to the probe for contacting the wafer is controlled by a spring-loaded mechanism acting on the probe 10 and by controlling the distance between the probe mount and the wafer surface. The contact of the cathode 12 is made at the side edge of the wafer so that the n-GaN layer can be accessed. The two electrodes 10,12 together with the epi-wafer form a temporary LED structure. When current is injected into the wafer from the probe 10, luminescence under the probe occurs and the emitted light is collected from sensors both in the front and back sides of the wafer through optical fibers 14 and a spectrometer 16. The data output of the spectrometer is acquired by a computer processor 18 for analysis and display. A power source 20 controls the level of current injected into the wafer W. The measurements are made on the sample surface by moving the probe or the sample sequentially between locations of interest. After one or a series of measurements have been taken at a location, a stage (not shown) moves the sample or the probe to the next sample location for the next measurement.

While the conductive silicone tip used on a spring-loaded probe as described above produces significant improvements over conventional metallic and other soft-tip probes, certain problems remain unsolved. For instance, when the conductive silicone tip is pressed against the wafer surface, even a very smooth surface, each metal flake incorporated in the silicone tends to make a point contact with the wafer and only silicone material contacts the areas surrounding the points of contact. Thus, while the quality of the contact is uniform in a coarse sense, it is very non-uniform in a microscopic sense and, the conductivity of silicone being negligible in comparison to that of metal, hot spots tend to form in point-contact areas. The present invention describes a new structure and a method of manufacture for a probe that embodies both the conformability and the uniform conductivity that are essential for reliable and repeatable light-emitting semiconductor wafer testing.

BRIEF SUMMARY OF THE INVENTION

In general, the invention lies in the concept of improving the uniformity of contact between the probe and the underlying wafer surface by adding a new layer of highly conductive material at the tip of the conductive silicone currently used in the most advanced equipment for EL semiconductor material characterization. The idea is to provide a metallic layer suitable for much denser point contact than possible with the flake particles incorporated in the conductive silicone used at the tip of current probes. To that end, a thin layer of very small metallic spheres, preferably made of silver (though, but for their cost, gold or other noble metals would be even more preferred) no more than a few micrometer in diameter, is attached to the surface at the tip of the conductive silicone. As a result, the probe retains its ability to conform to surface roughness in the wafer because of the resilience of the silicone component, while at the same time materially improving the uniformity of contact with the wafer surface. Because of the very small diameter of the spheres contacting the wafer, the spatial density of point contacts is increased dramatically with attendant increased and greater uniformity of conductance.

Thus, one aspect of the invention lies in a probe that includes a distal layer of conductive silicone attached to a conventional metallic pin and a thin layer of micrometer-size metallic spheres adhered to the silicone so as to form a flat and smooth metal tip in the probe. According to another aspect of the invention, a method of manufacture was developed that proved to be particularly suitable for controlling the thickness and the adherence of the metal layer. Because these probes are used in a relatively small number of apparatus and last for thousands of tests, the method can be carried out advantageously in manual fashion, without a need for automation. Though not preferred, we found that particles of other shapes and other methods of attaching them to the resilient conductive layer of the probe also produce significant improvements over the prior art, the quality depending on the resulting smoothness of the surface, its degree of flexibility, and the density of point contacts made with the underlying surface when the probe is pressed against it.

The preferred process of manufacture of the probe of the invention utilizes a fixture that includes a first part for the deposition of the distal metal-sphere layer, a second part for the deposition of conductive silicone over the metal layer, and a spring-loaded device for compressing the metal pin onto the silicone so as to incorporate it in straight alignment. The first part of the fixture is a bottom plate with a flat circular recess corresponding to the desired dimensions of the metal layer at the tip of the probe. As a first step of manufacture, the recess is completely filled with the metal spheres so as to form a layer of a predetermined thickness.

The second part of the fixture is a top plate with a perforation of cross-section equal to the size of the recess in the bottom plate and adapted to receive in snug engagement the metal pin of the probe. The thickness of the top plate (and correspondingly the depth of the perforation) exceeds the desired thickness of the silicone layer in the probe so as to leave room for compression of the silicone placed in the perforation. A plate thickness of about twice the desired thickness of the silicone layer turned out to work well. The bottom surface of the top plate is adapted to fit precisely over the top surface of the bottom plate so as to form a leak-proof contact between the edges of the perforation and the recess when the plates are assembled in alignment of the two. The second step of the manufacturing process thus involves assembling the two plates so that the perforation of the top plate lies over the layer of spheres deposited in the recess of the bottom plate and in filling the perforation with uncured conductive silicone. Note that the size and shape of the recess in the bottom plate can be adjusted as desired to obtain probes with tips of different dimensions following the same steps outlined here.

The next step involves placing the probe pin in the perforation under the pressure provided by the spring-loaded device in order to compress the uncured silicone to increase its metal-flake density and improve diffusion of the silicone into the underlying layer of metallic spheres. Alternatively, a spring-loaded pin can be used in a support structure without the need for a separate device to exert pressure on the pin. As a result of the compression placed on the silicone, part of the silicone material, free of metal flakes, will be squeezed out of the perforation through the space between the pin and the interior surface of the perforation. The conductive silicone is then allowed to cure, either at room temperature or in an oven to speed up the process, and then removed from the fixture. The resulting product is a highly conductive probe that includes a thin layer of microscopic metal spheres adhered to the layer of conductive silicone.

Various other aspects and advantages of the invention will become clear from the description that follows and from the novel features particularly recited in the appended claims. Therefore, to the accomplishment of the objectives described above, this invention consists of the features hereinafter illustrated in the drawings, fully described in the detailed description of the preferred embodiments, and particularly pointed out in the claims. However, such drawings and description disclose only some of the various ways in which the invention may be practiced.

BRIEF DESCRIPTION OF THE DRAWINGS

FIG. 8 shows schematically the bottom plate of an exemplary set-up suitable for manufacturing a probe according to the invention.

FIG. 9 illustrates a recess in the plate of FIG. 8 filled with micrometer-size spherical particles to form the distal metal layer of the probe of the invention.

DETAILED DESCRIPTION OF THE INVENTION

The invention is a novel conductive probe for characterizing semiconductor materials, in particular electroluminescent (EL) semiconductor wafers in the course of manufacturing light-emitting devices (LEDs). As illustrated in the probe 30 of FIG. 3, the novelty lies in a thin layer 32 of preferably spherical metallic particles of sufficiently small size to ensure a high spatial density of point contacts when the probe engages the surface of the wafer under test. The layer 32 of metallic particles is attached to a thicker layer 34 of cured conductive elastomer, such as silicone, preferably by contacting the metal layer with uncured silicone and then curing it to produce adhesion. The conductive silicone layer 34 is itself similarly attached to a spring-loaded metal pin 36, thereby producing a spring-loaded probe with a metal tip capable of deformation to conform with very high degrees of uniformity and density of point contacts to irregularities in the surface of the wafer under test. As a result, the conductance at the tip of the probe is increased and, more importantly, the current density during testing is more uniform across the contact area of the wafer surface, which produces more repeatable and reliable test results.

We found that a layer 32 up to about 500-micrometer thick of silver spheres 1-2 micrometers in diameter adhered to a 0.1-1.0 mm layer 34 of conductive silicone at the tip of the probe provides greatly improved LED-characterization results when compared to conventional probes, including probes with a conductive silicone tip. The probe of the invention was able to conduct higher and more uniform currents, as evidenced by the lack of hot spots and light drifts during testing. As a result, the LED wavelength measurements recorded by the new probe were more uniform than previously experienced with conventional probes.

Figure 4:
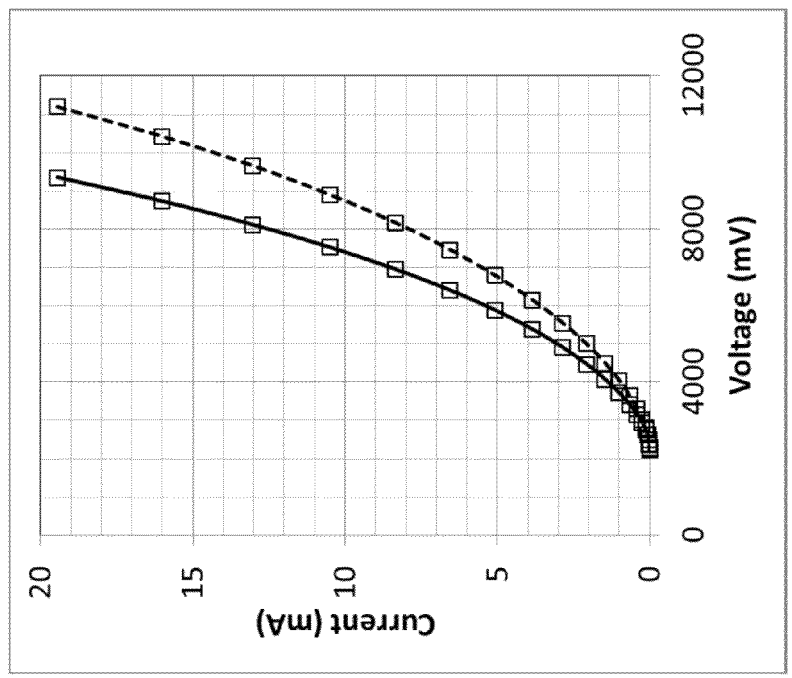
FIG. 4 illustrates the smaller contact resistance exhibited by the probe of the invention compared to a prior-art conductive probe with the same contact area.
Figure 5:
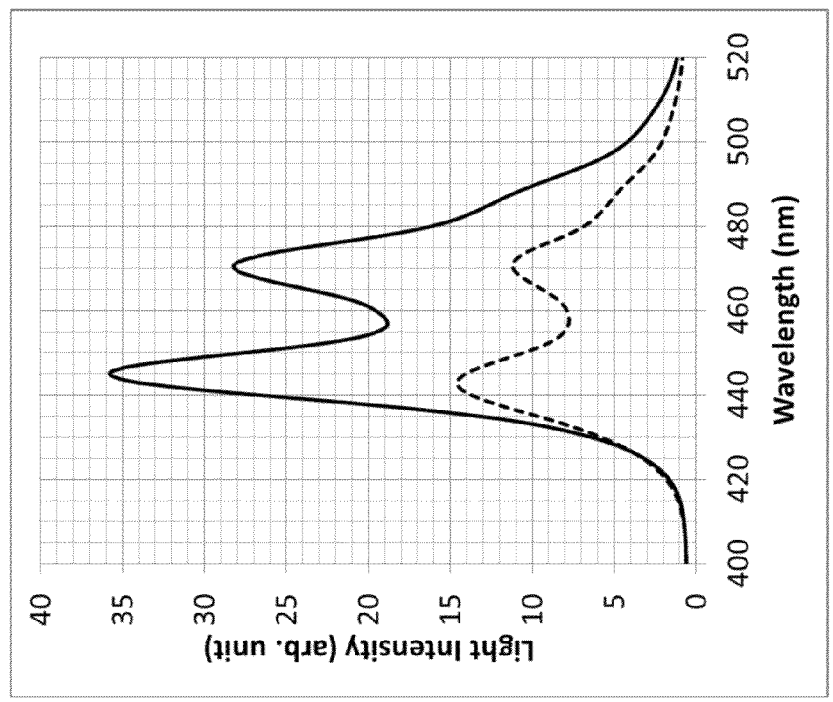
FIG. 5 illustrates the larger light output exhibited by the probe of the invention compared to a prior-art conductive probe with the same contact area.

For instance, FIG. 4 illustrates the materially smaller contact resistance exhibited by the probe of the invention as compared to a prior-art conductive probe with the same contact area. The voltage associated with all levels of current throughput were found to be smaller for the probe of the invention (solid curve) than for a conventional conductive silicone probe (dash line). Similarly, FIG. 5 illustrates the materially larger light intensity produced by the probe of the invention as compared to the prior-art conductive probe with the same contact area. The light emitted at all wavelengths of the spectrum was greater for the probe of the invention (solid curve) than for a conventional conductive silicone probe (dash line).

Figure 6:
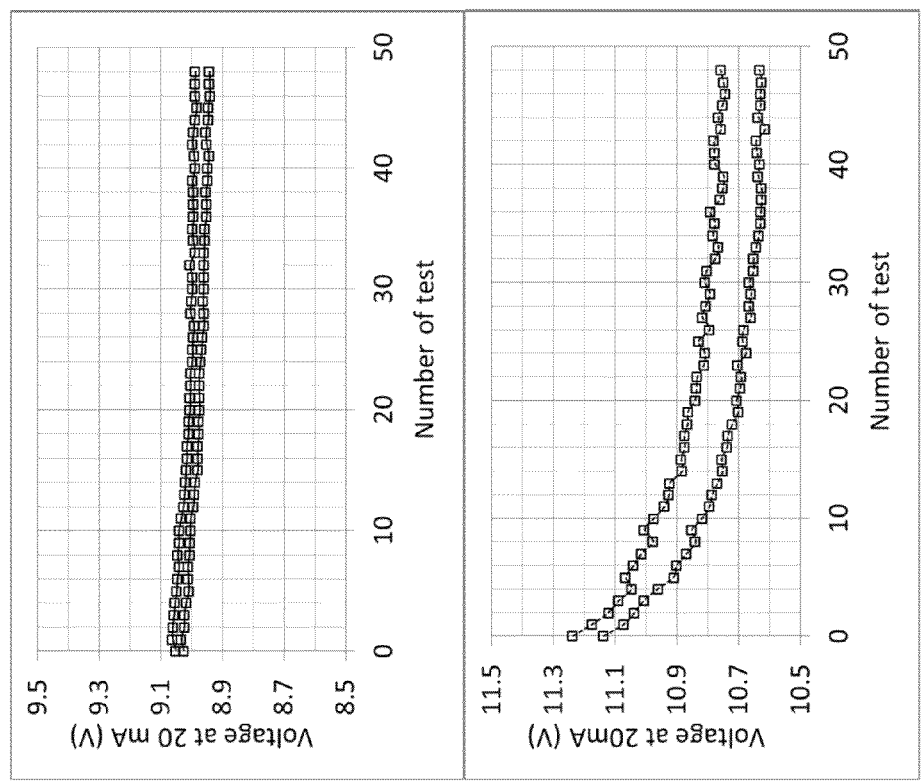
FIG. 6 illustrates the greater voltage stability exhibited by the probe of the invention compared to a prior-art conductive probe in a series of successive tests conducted with the same current level.
Figure 7:
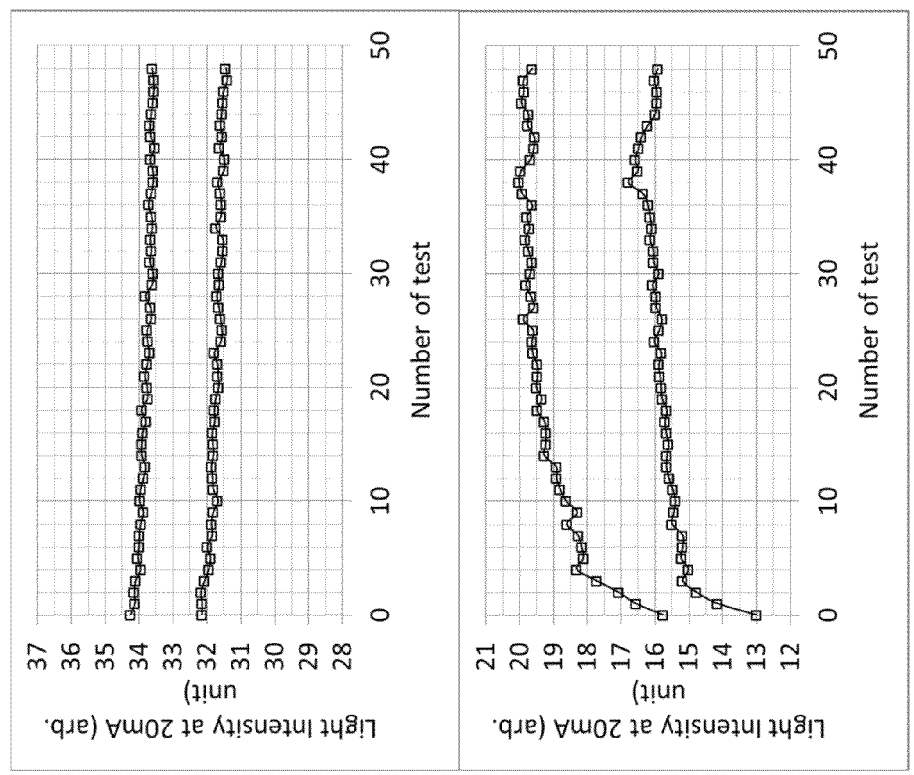
FIG. 7 illustrates the greater light output stability exhibited by the probe of the invention compared to a prior-art conductive probe in a series of successive tests conducted with the same current level.

FIG. 6 shows the greater voltage stability of the probe of the invention compared to a prior-art conductive probe. In a series of successive tests conducted with two sets of probes at the same current level, the voltage of the probes of the invention remained close to constant (top graphs), thereby proving the validity and repeatability of successive measurements, while the comparative prior-art probes showed a marked decline in the voltages recorded (bottom graphs). Finally, FIG. 7 illustrates also the greater stability of electroluminescence produced by the probe of the invention compared to the prior-art conductive probe. In a series of successive tests conducted with two sets of probes at the same current level, the light emitted by the probes of the invention remained close to constant (top graphs), thereby proving again the validity and repeatability of successive measurements, while the comparative prior-art probes showed a marked increase in the light output (bottom graphs).

It is understood that the metallic particles used to make up the layer 32 at the tip of the conductive silicon layer 14 are preferably spherical because spheres are the optimal shape to maximize the density of point contact when the probe is pressed against a test surface, but other shapes may be used as well as long as the size of the particles is limited to a few micrometers in nominal diameter. As used herein, nominal diameter is intended to mean the diameter of a hypothetical sphere having the same volume of a given non-spherical particle, such as a flake. Silver is typically used for high-conductance applications, but other conductive materials such as graphite, copper, silver-coated copper, nickel and noble metals may be used if preferable for other applications. The metal particles may be attached to the conductive silicone layer by any conventional means, such as by depositing the particles and an adhesive or brushing a paint containing metal flakes over the surface of the silicone. However, we found that the process described below produces probes of proven reliability over many thousands of tests. Therefore, the probe of the invention is preferably manufactured according to this process.

The process involves the use of a bottom plate 40, illustrated in FIG. 8, with a recess 42 for receiving the metallic particles to be adhered to the conductive silicone layer of the probe. The recess 42 has a flat bottom, has a depth t preferably no more than about 500 micrometers, and has a cross section shaped like the desired contact area of the probe, typically the same as the metal pin 36 constituting the bulk of the probe 30. These probes are usually circular in cross-section, so the recess 42 would also be circular in shape. As a first step of manufacture, the recess 42 is completely filled with the metal spheres so as to form a layer 44 of thickness equal to the depth t of the recess 42, as illustrated in FIG. 9.

Figure 10:
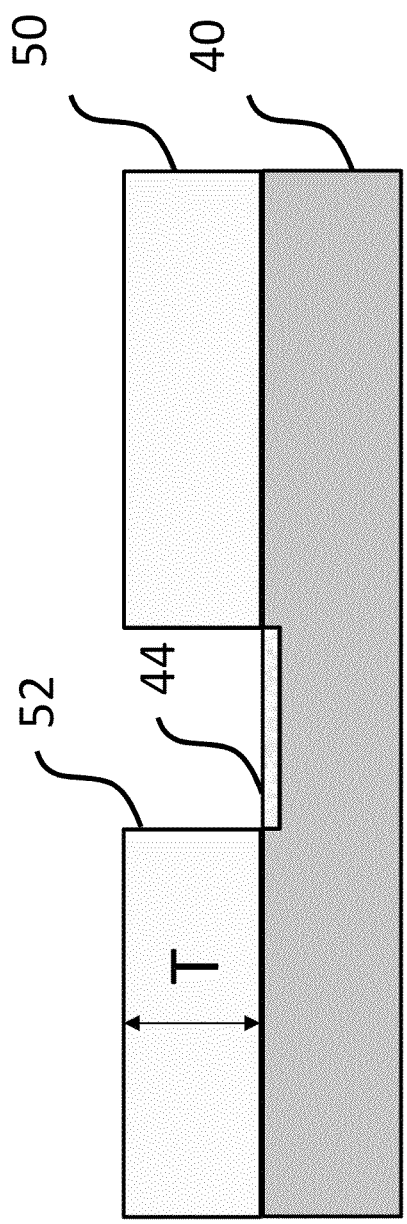
FIG. 10 shows schematically the top and bottom plates of the manufacturing set-up of the invention assembled after filling the recess in the bottom plate with micrometer-size metallic spheres.

A top plate 50, shown in FIG. 10 placed over the bottom plate 40, features a perforation 52 of cross-section equal to the size of the recess 42 (note that area of the recess may be smaller if a smaller contact area is desired). The bottom surface of the top plate 50 is adapted to fit precisely over the top surface of the bottom plate 40 so that the edges of the perforation 52 and the recess 42 form a seal substantially capable of preventing leakage of material between the plates after they are assembled with the perforation 52 aligned over the recess 42. The perforation 52 is sized to receive the metal pin 36 of the probe in snug engagement, so that the pin can slide through it without excessive play. The thickness T of the top plate 50 (and correspondingly the depth of the perforation) is greater than the desired thickness of the silicone layer in the probe (about twice the thickness proved to be appropriate to practice the invention as described).

Figure 11:
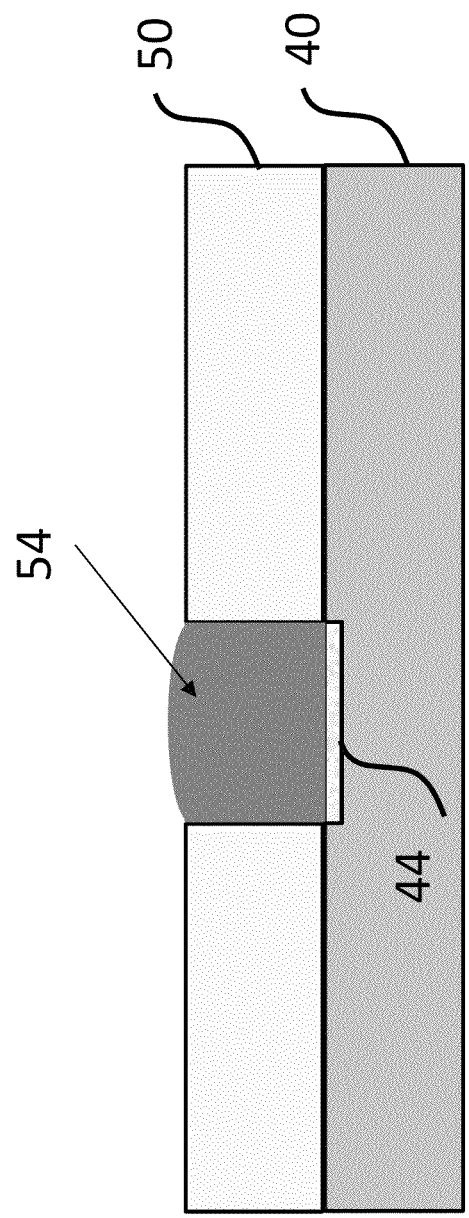
FIG. 11 shows the set-up of FIG. 10 after filling the perforation in the top plate with uncured conductive silicone.
Figure 12:
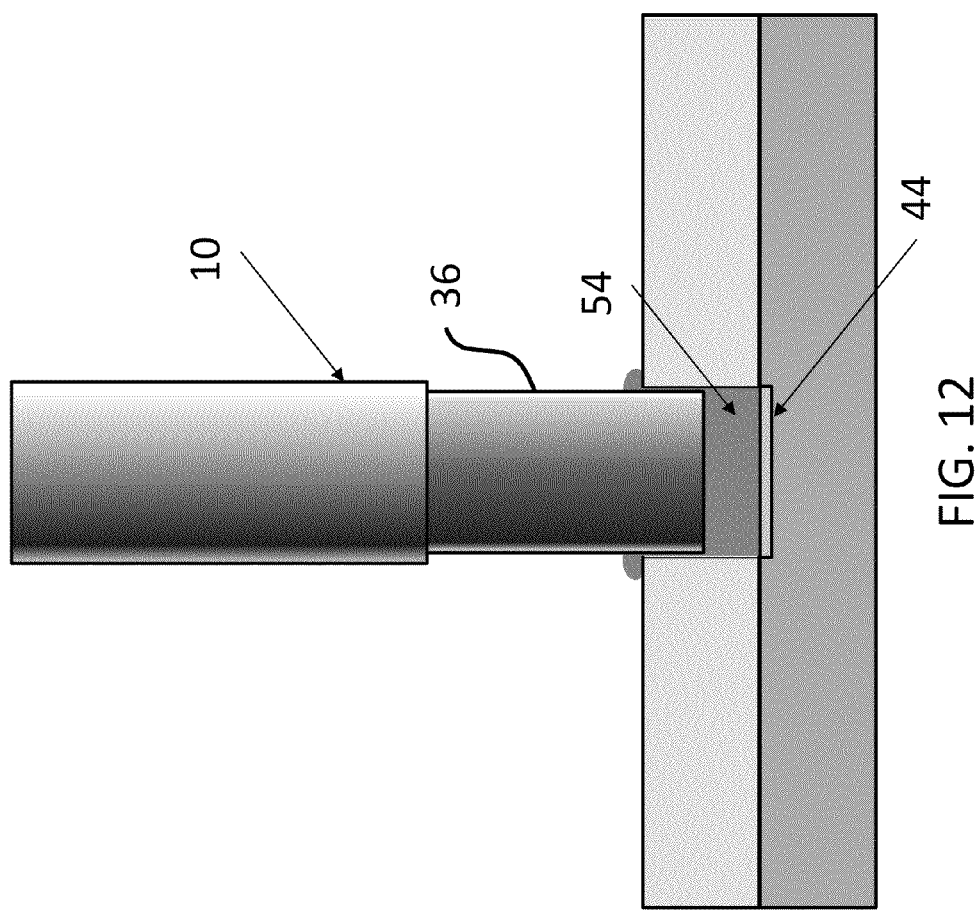
FIG. 12 illustrates the spring-loaded pin of the probe inserted into the perforation in the top plate of the manufacturing set-up and pressing against the uncured conductive silicone to compress it, cause its diffusion into the underlying metal particles, and squeeze excess silicone out of the perforation.

The next step of the manufacturing process involves assembling the two plates so that the perforation 52 of the top plate lies over the layer 44 of spheres deposited in the recess 42 of the bottom plate. Securing means (not shown) are preferably used to ensure that the two plates 40,50 remain coupled as a sturdy assembly. Next the perforation 52 is filled with uncured conductive silicone, a step that can be performed simply by squeezing it into the hole to form a layer 54 of material, as shown in FIG. 11. Then the metal pin 36 (see also FIG. 3) of a conventional spring-loaded probe sized to fit snugly into the perforation 52 is inserted into it under sufficient pressure to cause the pin's penetration down the length T of the perforation. The tip of the pin can be, and preferably is, roughened with sand paper or the like in order to improve adhesion. Using RTV silicone in a perforation about 2 mm deep and 1.7 mm in diameter, we found that a force of about 6-7 ounces exerted on the pin 36 produced a travel of about 1 mm, thus reducing the thickness of the silicone layer. As a result, the density of the metal particles incorporated in the conductive silicone increased, providing a corresponding increase in the conductivity of the material, while retaining substantially its original elasticity. We also found that the uncured silicone permeates through the voids in the bottom layer 44 of microscopic particles and binds them strongly together and to the upper layer of conductive silicone.

Figure 1:
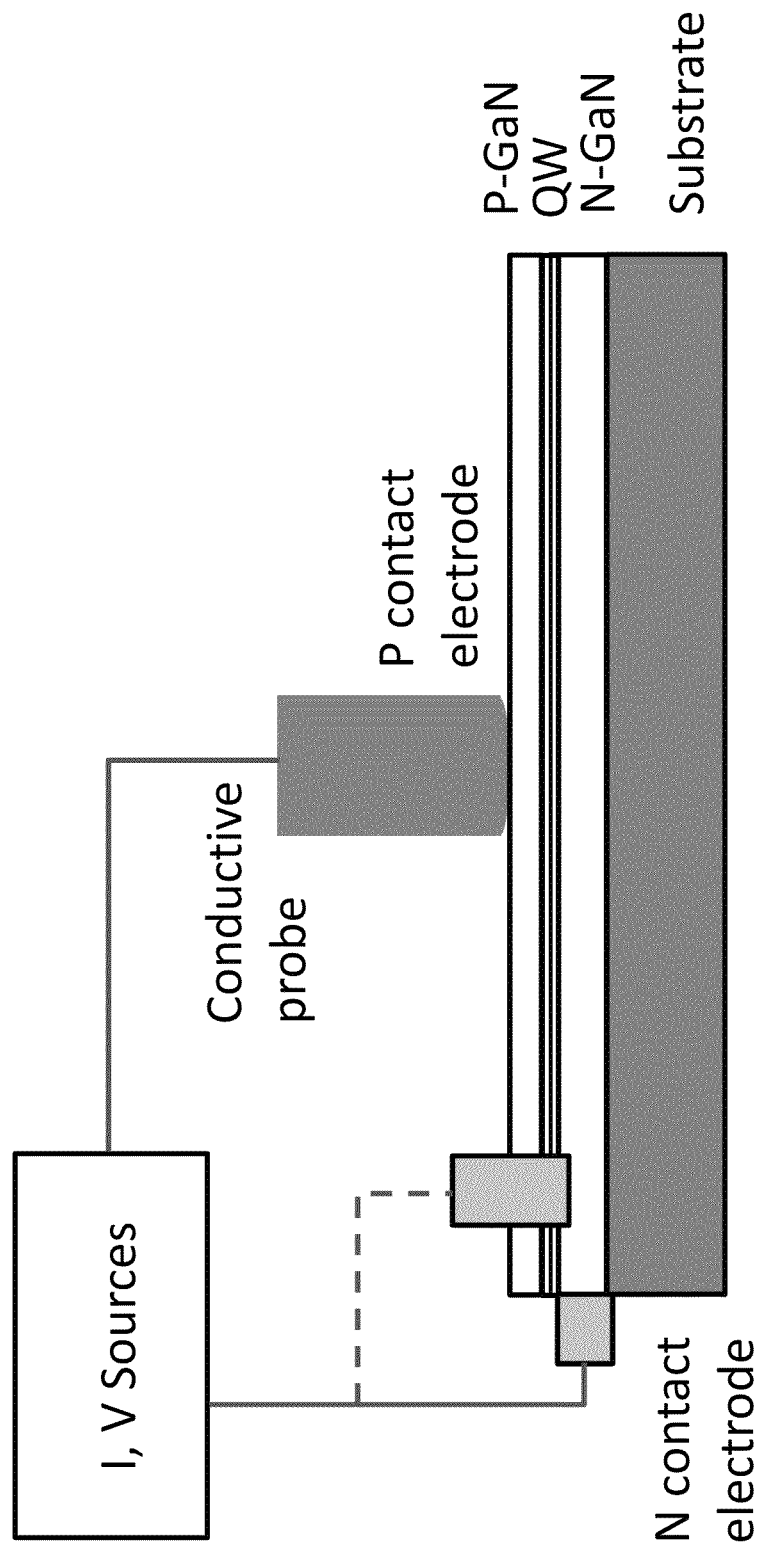
FIG. 1 is a schematic illustration of a conventional probe used to test light-emitting semiconductor wafers.
Figure 2:
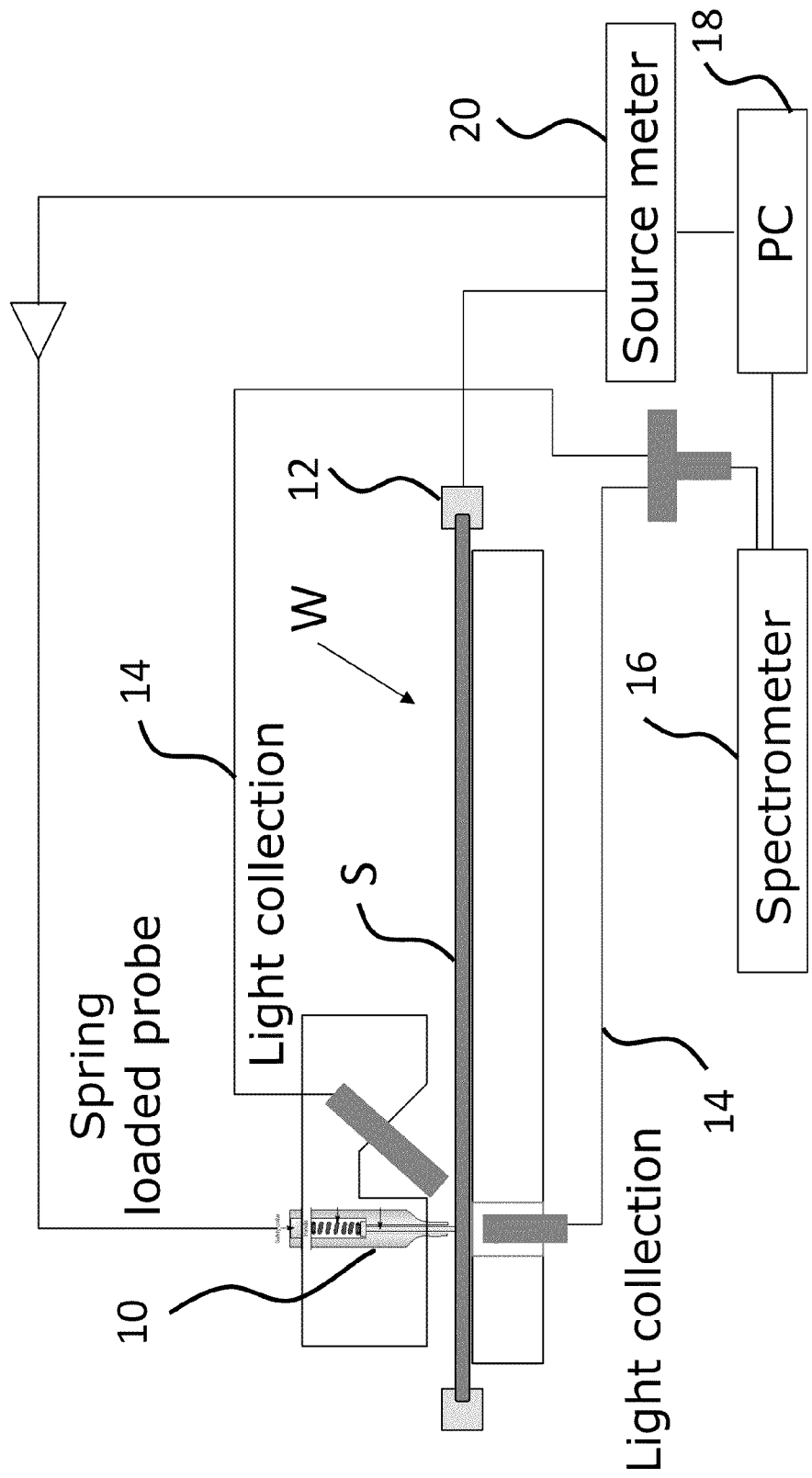
FIG. 2 illustrates a probe station with a spring-loaded conductive-silicone tip used for light-emitting epi-wafer characterization.
Figure 3:
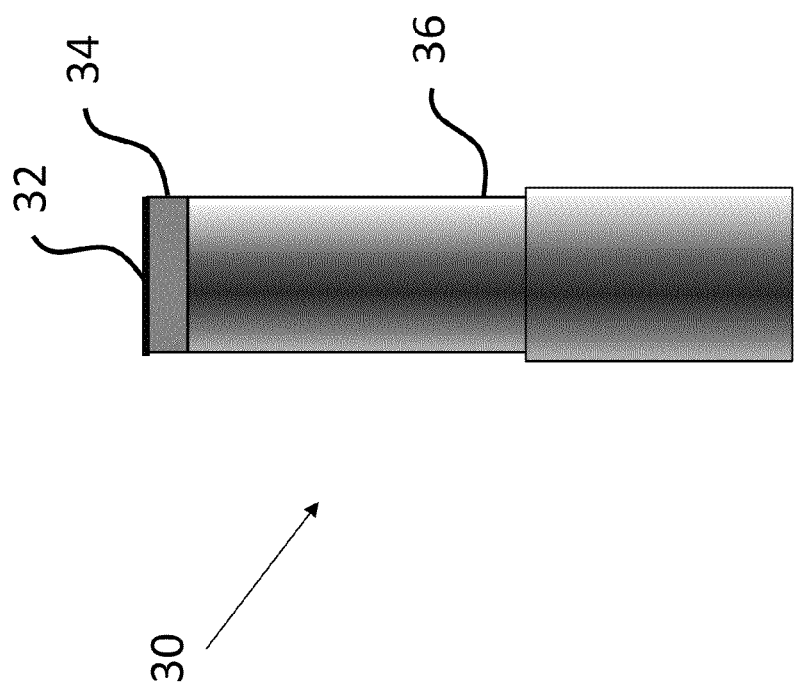
FIG. 3 is a schematic representation of a probe with a distal metallic layer according to the invention.

Once the components of the probe are so combined under pressure, the silicone is allowed to cure in the fixture to form the single structure of FIG. 3. The curing process can be carried out at room temperature or in an oven to speed it up. We found that curing at room temperature for about 20 hours followed by exposure to a temperature of about 75 degrees Centigrade in an oven for another 5 hours produces very good adhesion of the three components, ready for reliable extended use.

Figure 13:
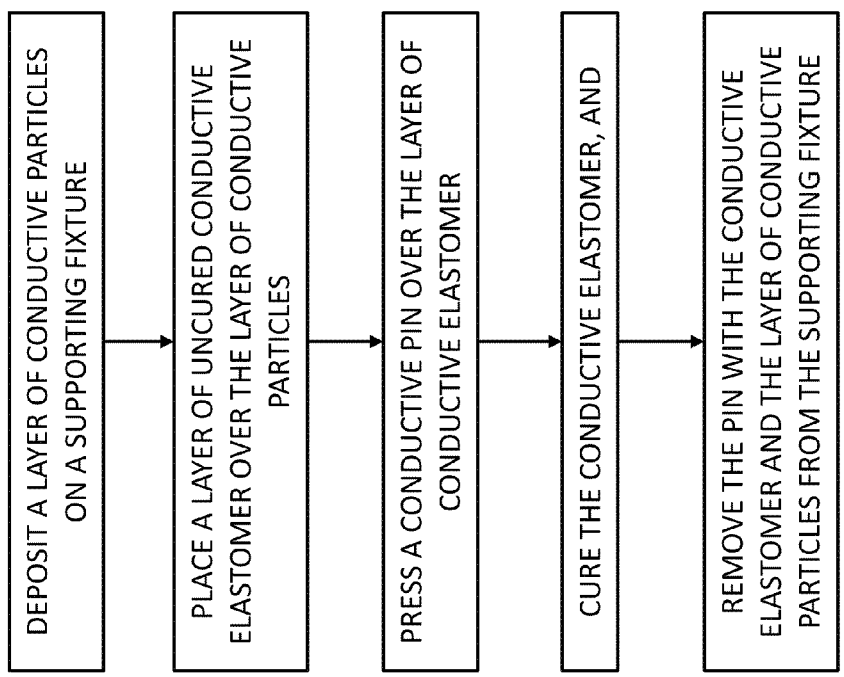
FIG. 13 is a flowchart of the basic steps involved in the preferred process of manufacture of the invention.

FIG. 13 is a flowchart of the preferred manufacturing process of the invention. It is understood that the probe 30 could be made using other techniques, but the process outlined therein has proven to produce probes that are durable, reliable for repeatability, and consistent in LED-testing performance.

Various changes in the details that have been described may be made by those skilled in the art within the principles and scope of the invention herein illustrated and defined in the appended claims. For example, the invention has been described in terms of conductive silicone, but any conductive elastomer capable of coupling with a distal layer of metallic particles according to the invention would be suitable to its practice. Any rigid conductive material would be a suitable replacement for the metallic pin used in the description. Similarly, the process of the invention could be reversed with a layer of conductive elastomer deposited over a probe pin in a mold, followed by metal particles being adhered to or painted over the layer of elastomer. Thus, while the invention has been shown and described in what are believed to be the most practical and preferred embodiments, it is recognized that departures can be made therefrom within the scope of the invention, which is not to be limited to the details disclosed herein but is to be accorded the full scope of the claims so as to embrace any and all equivalent apparatus and methods.

The invention claimed is:

1. A conductive probe for characterizing a semiconductor material, comprising:
   a conductive pin adapted for mechanical and electrical connection with semiconductor-material testing apparatus;
   a layer of conductive elastomer attached to a distal end of the pin; and
   a separate and distinct layer of conductive particles adhered to a top surface of the layer of conductive elastomer.

2. The probe of claim 1, wherein said pin is a spring-loaded metal pin.

3. The probe of claim 1, wherein said elastomer includes silicone.

4. The probe of claim 3, wherein said layer of conductive elastomer incorporates metallic flakes.

5. The probe of claim 3, wherein said layer of conductive elastomer is about 0.1 to 1.0 mm thick.

6. The probe of claim 1, wherein said layer of conductive particles is less than 500 micrometers thick.

7. The probe of claim 1, wherein said conductive particles are less than about 2 micrometers in nominal diameter.

8. The probe of claim 1, wherein said conductive particles include particles selected from the group consisting of silver, graphite, copper, silver-coated copper, nickel, and noble metals.

9. The probe of claim 8, wherein said conductive particles are spherical silver particles.

10. The probe of claim 1, wherein said pin is a spring-loaded metal pin, said elastomer includes silicone and incorporates metallic flakes, said distinct layer of conductive particles is less than 500 micrometers thick and contains spherical silver particles less than 2 micrometers in diameter.

11. A process for making a probe for characterizing a semiconductor material, comprising the following steps:
    depositing a layer of conductive particles on a supporting fixture, said layer being free of conductive elastomer;
    placing a separate and distinct layer of uncured conductive elastomer over said layer of conductive particles;
    placing a conductive pin over said layer of conductive elastomer; and
    curing the conductive elastomer.

12. The process of claim 11, wherein said supporting substrate is a recess in a bottom plate.

13. The process of claim 12, wherein said step of placing a layer of uncured conductive elastomer over said layer of conductive particles is carried out in a perforation in a structure overlaying the layer of conductive particles.

14. The process of claim 13, wherein said step of placing a conductive pin over said layer of uncured conductive elastomer is carried out applying sufficient pressure thereon to reduce said layer of uncured conductive elastomer to a predetermined thickness.

15. The process of claim 14, further including the step of removing the pin with the conductive elastomer and the layer of conductive particles from the supporting fixture after said curing step.

16. The process of claim 15, wherein said structure is a top plate adapted for coupling to the bottom plate with the perforation in alignment with said recess.

17. The process of claim 11, wherein said pin is a spring-loaded metal pin.

18. A process for making a probe for characterizing a semiconductor material, comprising the following steps:
    placing a layer of uncured conductive elastomer over a conductive pin held in a mold;
    depositing a separate and distinct layer of conductive particles over a top surface of said layer of uncured conductive elastomer in the mold;
    curing the conductive elastomer; and
    removing the pin from the mold.

19. The process of claim 18, wherein said step of depositing a separate and distinct layer of conductive particles over the layer of uncured conductive elastomer is carried out by painting said conductive particles over the elastomer.

20. The process of claim 18, wherein said pin is a spring-loaded metal pin.

* * * * *